(12) United States Patent
Perez

(10) Patent No.: US 7,557,658 B2
(45) Date of Patent: Jul. 7, 2009

(54) LOW VOLTAGE AMPLIFIER HAVING A CLASS-AB CONTROL CIRCUIT

(75) Inventor: Raul A. Perez, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 640 days.

(21) Appl. No.: 10/942,433

(22) Filed: Sep. 16, 2004

(65) Prior Publication Data
US 2007/0200629 A1   Aug. 30, 2007

Related U.S. Application Data

(60) Provisional application No. 60/586,013, filed on Jul. 7, 2004.

(51) Int. Cl.
*H03F 3/26* (2006.01)
(52) U.S. Cl. .................................... 330/255; 330/267
(58) Field of Classification Search ................. 330/255, 330/267, 268
See application file for complete search history.

(56) References Cited

U.S. PATENT DOCUMENTS 5,311,145 A * 5/1994 Huijsing et al. .............. 330/255

6,828,855 B1 * 12/2004 Wang .......................... 330/253

* cited by examiner

*Primary Examiner*—Steven J Mottola
(74) *Attorney, Agent, or Firm*—William B. Kempler; W. James Brady; Frederick J. Telecky, Jr.

(57) ABSTRACT

A low voltage amplifier having a class-AB control circuit which generates minimal or no surge current when the output of the amplifier clips to ground or the negative rail. The amplifier includes an input stage, a summing circuit, a class-AB control circuit and an output stage. The input stage connects to a first current source and couples to receive a pair of differential input signals to generate intermediate signals that are summed together using the summing circuit. A second current source supplies the summing circuit with current. The class-AB control circuit receives the summed signals from the summing circuit to provide control for the output stage which generates the amplifier result at the output of the amplifier which delivers current to drive an external load. Specifically, the class-AB control circuit is improved by the addition of a PMOS device connected in such a way to cut off the DC current path that is generated during the output stage clipping condition by a diode connected PMOS device and a NMOS sensing device both located near the output of the class-AB control circuit. Thereby, the additional PMOS device minimizes the surge current generated by the NMOS sensing device when the output of the amplifier clips to ground or the negative rail.

4 Claims, 6 Drawing Sheets

LOW VOLTAGE AMPLIFIER HAVING A CLASS-AB CONTROL CIRCUIT

This application claims priority under 35 U.S.C. § 119(e) of provisional application Ser. No. 60/586,013 filed Jul. 7, 2004.

FIELD OF THE INVENTION

The present invention relates to the field of differential amplifiers and operational amplifiers and more particularly to an amplifier of this kind fabricated in integrated circuit technology having a rail-to-rail common mode range at the amplifier output.

BACKGROUND OF THE INVENTION

With the reduction of feature size in complementary metal oxide semiconductor (CMOS) processes, supply voltage requirements decrease. This higher integration density provides that each digital and analog cell in a mixed signal very-large-scale-integration (VLSI) circuit consumes less power. There is a benefit to the digital cells in that performance improves; however, analog cells suffer from the reduction in size since minimum size transistors cannot be used due to noise and offset requirements. Low supply voltage requirements dictate a need for complex circuit solutions, which in some cases result in performance degradation. Thereby efficient topologies that combine low-voltage operation with high power efficiency and small die area is the solution for analog cells.

An improved class AB control circuit is presented in the following publication: "Compact Low-Voltage Power-Efficient Operational Amplifier Cells for VLSI" by Klaas-Jan de Langen and Hohan H. Huijsing-IEEE Journal of Solid-State Circuits, Vol. 33, No. 10, October 1998 pages 1482-1496 which is incorporated by reference herein. A suitable class AB control circuit having a low number of components and low current consumption is shown in FIG. 1 and is similar to the control circuit shown in FIG. 7 of the foregoing reference. The op-amp has a PMOS input stage $MP_{INM1}$ and $MP_{INP1}$, allowing common-mode input voltage down to the negative rail. The input stage drives a cascoding and summing circuit including a current mirror $MN_8$ and $MN_9$, and cascodes $MN_{10}$, $MN_{11}$, $MN_{12}$, $MP_5$, $MP_6$, and $MP_7$. The summing circuit drives the output stage $MP_8$ and $MN_{15}$ and the class-AB control circuit $MP_9$, $MP_{10}$, $MP_{11}$, and $MN_{14}$. The class AB control uses the simple minimum selector $MP_9$, $MP_{10}$, and $MP_{11}$. In operation, the current of transistor $MN_{15}$ is measured by transistor $MN_{14}$. The drain current of transistor $MN_{14}$ flows through mirror $MP_9$ and $MP_{10}$, which is a part of the minimum selector circuit $MP_9$, $MP_{10}$, and $MP_{11}$. Transistor $MP_{10}$ of the minimum selector circuit operates mainly in the linear region. Only when transistor $MP_8$ handles large output current does transistor $MP_{10}$ operate in saturation. Transistor $MP_{11}$ measures the current of transistor $MP_8$ and is also part of the minimum selector. The drain current of transistor $MP_{11}$, which is the output of the minimum selector, flows through transistor $MN_7$ and steers the class-AB amplifier cascode $MN_{10}$, $MN_{11}$, $MN_{12}$, $MP_5$, $MP_6$, and $MP_7$.

This architecture is capable of having a supply voltage $V_{CC}$ as low as the sum of twice the drain voltage at saturation ($2V_{dsat}$) and the gate-to-source voltage $V_{gs}$, wherein $V_{CC}=V_{gs}+2V_{dsat}$. This architecture is one of the several known architectures that have the capability of having a lower supply voltage and having a double cascode high impedance node. Moreover, the disclosed class AB control circuit does not introduce additional non-dominant poles as with other known implementations. As a result, this architecture has the best AC performance. Accordingly, the required power for a given bandwidth and phase margin is minimized.

The class-AB control circuit within the amplifier shown in FIG. 1, however, has a significant disadvantage. Specifically, when the output of the amplifier clips to ground or the negative rail, a surge of current is pulled from the power supply. Accordingly, NMOS device, transistor $MN_{15}$ goes into the linear triode region because its drain-to-source voltage $V_{ds}$ is lower than what is necessary for it to stay in saturation. Accordingly, sensing NMOS device, $MN_{14}$, remains in saturation. Accordingly, when transistor $MN_{15}$ goes into the linear region for a given amount of drain current, the gate-to-source voltage $V_{gs}$ of transistor $MN_{15}$ is much higher in the linear region. Thus, since transistor $MN_{14}$ is still in the saturation region, it has been conditioned to expect that transistor $MN_{15}$ will send substantially less current than when it is does during output clipping. Thereby, the gate-to-source voltage $V_{gs}$ of transistor $MN_{15}$ causes a significantly larger amount of current to go through transistor $MN_{14}$. Accordingly, the ratio of the currents supplied to transistors, $MN_{14}$ and $MN_{15}$, prior to the output of the amplifier being pulled low is 10/1. Yet, as a result of the output clipping, this same ratio changes to approximately 10/0.01. The drain of transistor $MN_{14}$ connects to the diode connected transistor $MP_9$. Transistor $MP_9$ provides as much current as it can to transistor $MN_{14}$. The only limitation of current supplied by transistor $MP_9$ is when the gate-to-source voltage $V_{gs}$ of transistor $MP_9$ is too large, wherein there is little voltage remaining if the gate-to-source voltage $V_{gs}$ is subtracted from the supply voltage. There, however, must be enough gate-to-source voltage $V_{gs}$ to keep transistor $MN_{14}$ 'on'. Thereby, there exists a supply dependency, wherein when the supply voltage is low, there will be less current surge but it will be on the order of 4 microns to 1.8-2.7 milliamps. This poses a significant problem. Furthermore, when the output voltage is below the drain voltage $V_{dsat}$ for transistor $MN_{15}$ at saturation, the gain of the summing circuit is dramatically reduced causing the voltage at the gate of transistor $MN_{15}$ or node $N_{17}$ to increase significantly. As a result, transistor $MN_{14}$ is biased at a DC point where a significant amount of additional current flows through transistor $MN_{14}$ on the order of several milliamps. The exact amount of additional current depends upon the power supply wherein a higher supply will generate a higher current.

A known approach to minimization of surge current produced by the class-AB control circuit within the amplifier has been to add a resistor between the drain of transistor $MN_{14}$ and the drain of transistor $MP_9$ to cause a voltage drop which will lower the amount of surge current. This approach, however, is not an adequate solution, in that it minimally limits the surge current; yet, a substantial amount of surge current exists. Additionally, while this approach reduces surge current, the value of the resistor varies with process, voltage, and temperature. Moreover, the minimized surge current remains power supply dependent.

Thus, there exists a need for a low voltage amplifier having a class-AB control circuit which generates minimal or no surge current when the output of the amplifier is driven low, in the case where the amplifier is used as a split supply.

The present invention is directed to overcoming, or at least reducing the effects of one or more of the problems set forth above.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

To address the above-discussed deficiencies of low voltage amplifiers, the present invention teaches a low voltage amplifier having a class-AB control circuit which generates minimal or no surge current when the output of the amplifier clips to ground or the negative rail. The amplifier includes an input stage, a summing circuit, a class-AB control circuit and an output stage. The input stage connects to a first current source and couples to receive a pair of differential input signals to generate intermediate signals that are summed together using the summing circuit. A second current source supplies the summing circuit with current. The class-AB control circuit receives the summed signals from the summing circuit to provide control for the output stage which generates the amplifier result at the output of the amplifier which delivers current to drive an external load.

Specifically, the class-AB control circuit includes a first and second p-channel transistor coupled such that the gates of the first and second p-channel transistor coupled together and the source of the first and second p-channel transistor coupled to the first power supply rail. A third p-channel transistor includes a source connected to the drain of the first transistor and a gate the couples to form a positive input to the class-AB control circuit. A fourth p-channel transistor includes a source that connects to the drain of the second transistor and a gate that connects to the gate of the third p-channel transistor to form a first terminal of the differential output. A first n-channel transistor includes a drain connected to the drain of the fourth p-channel transistor, a source connected to the second power supply rail, and a gate connected to the negative input to form a second terminal of the differential output for the class-AB control circuit. A second n-channel transistor includes a gate coupled to it's drain, wherein the drain connects to the drain of the third p-channel transistor. The source of the second n-channel transistor connects to the second power supply rail.

In operation, when the output of the amplifier clips to ground or the negative rail, a substantially smaller amount of surge current is pulled from the power supply in the form of an initial spike wherein a miniscule amount of current within the range of 50 to 150 microamps follows.

The advantages include but are not limited to a low voltage amplifier having a class-AB control circuit which generates minimal or no surge current when the output of the amplifier clips to ground or the negative rail. This amplifier is power supply independent. Moreover, the improved amplifier is less dependent on process variation. This solution provided by the improved amplifier completely eliminates the problems that arise as a result of surge current; whereas other solutions only diminish the effects of surge current.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1:
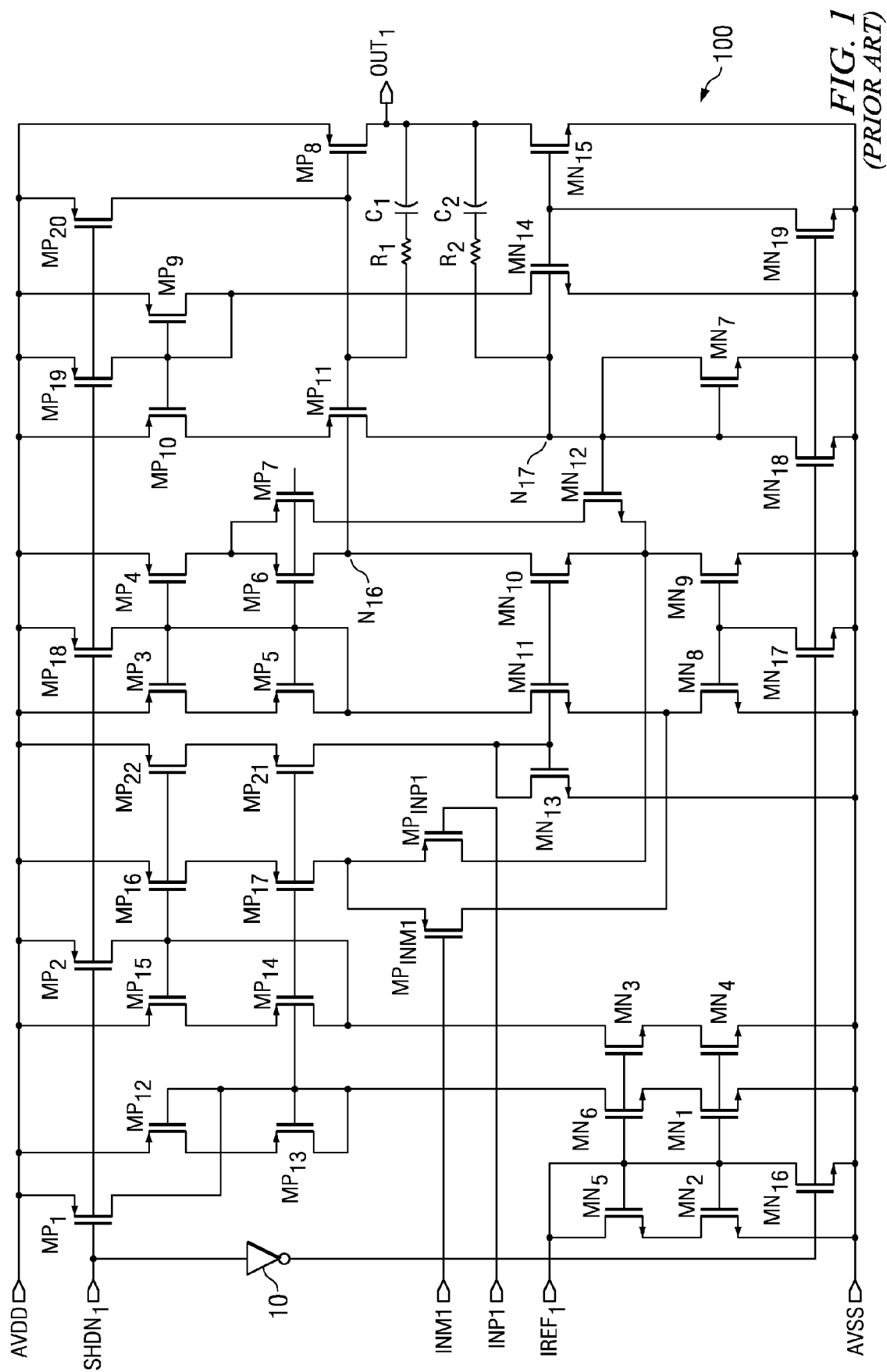
FIG. 1 illustrates a known low-voltage compact operational amplifier.

One or more exemplary implementations of the present invention will now be described with reference to the attached drawings, wherein like reference numerals are used to refer to like elements throughout. The various aspects of the invention are illustrated below in a low voltage amplifier having an input stage, a summing circuit, a class-AB control circuit, and an output stage, although the invention and the appended claims are not limited to the illustrated examples.

Figure 2:
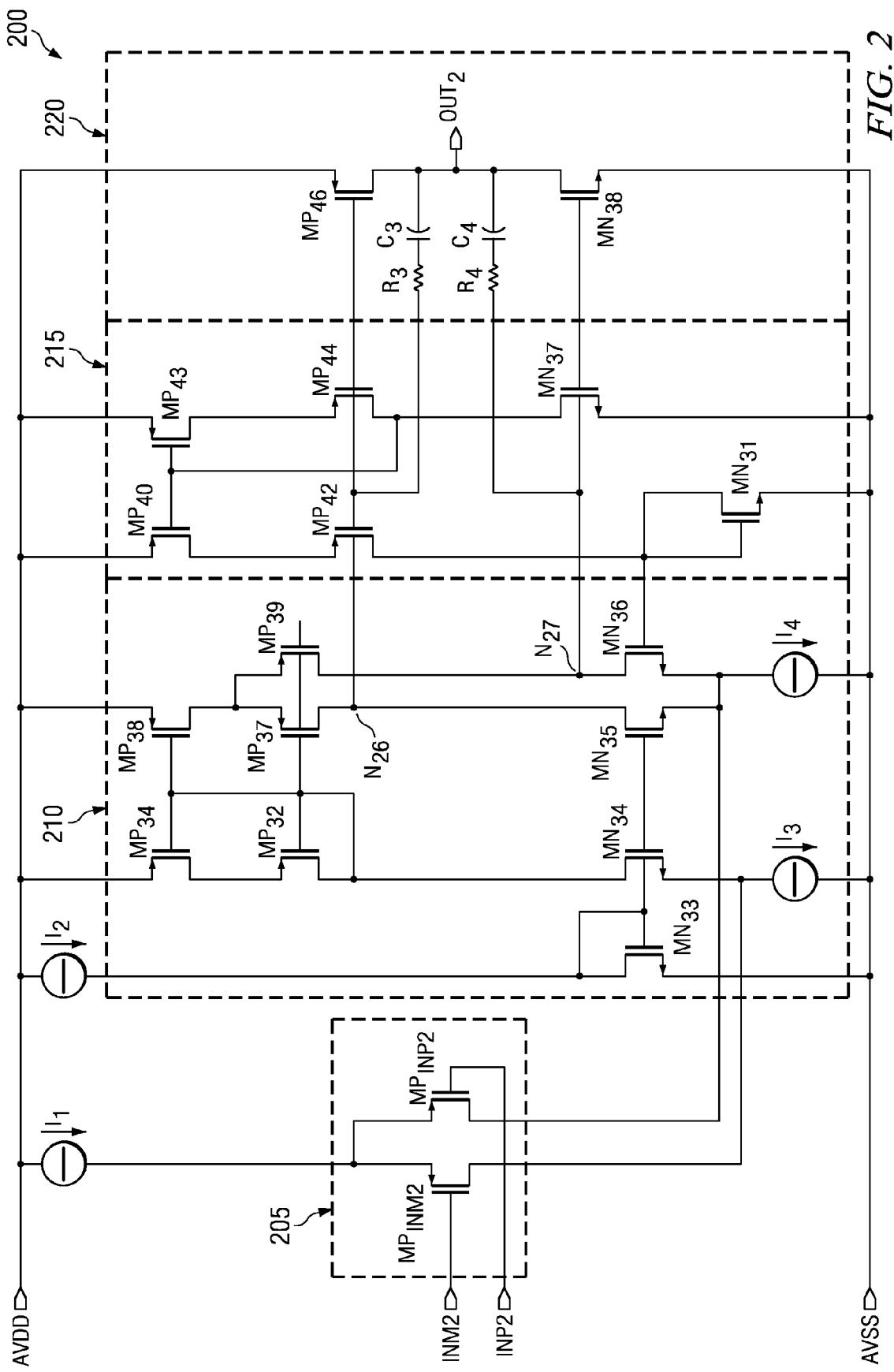
FIG. 2 displays a first embodiment of a low-voltage compact operational amplifier in accordance with the present invention.

One embodiment of the low voltage amplifier having a class-AB control circuit configured as a folded cascode amplifier which generates minimal or no surge current when the output of the amplifier clips to ground or the negative rail is illustrated in FIG. 2. As shown, an input stage 205 connects to receive a positive and a negative input, $INP_2$ and $INM_2$, to receive a differential input signal. A first and second current source, $I_1$ and $I_2$, connect to the input stage 205 and the summing circuit 210, respectively. Class-AB control circuit 215 connects between summing circuit 210 and output stage 220.

Specifically, input stage 205 includes a differential pair, wherein a first p-channel transistor $MP_{INM2}$ connected to a second p-channel transistor $MP_{INP2}$. The gate of the first p-channel transistor $MP_{INM2}$ connects to the negative input $INM_2$, while the gate of the second p-channel transistor $MP_{INP2}$ connects to the positive input $INP_2$. Both sources of the first and second transistors, $MP_{INM2}$ and $MP_{INP2}$, connect to the first current source $I_1$ which supplies bias current to the differential pair, $MP_{INM2}$ and $MP_{INP2}$. Summing circuit 210 connects to the input stage 205, wherein the drain of both transistors, $MP_{INM2}$ and $MP_{INP2}$, connect to the source on a first n-channel transistor $MN_{34}$ and source of a second n-channel transistor $MN_{35}$, respectively. A third current source $I_3$ connects between the second power supply rail $AV_{ss}$ and the source of transistor $MN_{34}$. The first transistor $MN_{34}$ connects with the third n-channel transistor $MN_{33}$ to form a current mirror, wherein the transistor $MN_{33}$ is diode coupled and the gates of transistors $MN_{33}$ and $MN_{34}$ connect together.

The drain of transistor $MN_{33}$ connects to receive current from the second current source $I_2$. The source of n-channel transistor $MN_{36}$ connects to the source of transistor $MN_{35}$, wherein a fourth current source $I_4$ connects between the source and the second power supply rail $AV_{SS}$. A pair of p-channel transistors, $MP_{35}$ and $MP_{37}$, couple to form another current source, wherein transistor $MP_{35}$ is the diode connected transistor that couples its gate to the gate of $MP_{37}$. P-channel transistor $MP_{39}$ connects to transistors $MN_{36}$ and $MP_{37}$, wherein the drain of transistor $MP_{39}$ couples to the drain of transistor $MN_{36}$ and the gate of transistor $MP_{39}$ connects to the gate of transistor $MP_{37}$. The drain of transistor $MP_{37}$ connects to the drain of $MN_{35}$. The drain of $MP_{35}$ connects to the drain of $MN_{34}$. The sources of transistors, $MP_{37}$ and $MP_{39}$, connect to a drain of p-channel transistor $MP_{38}$. The gate of transistor $MP_{38}$ couples to the gate of transistor $MP_{34}$, wherein the sources of both transistors $MP_{34}$ and $MP_{38}$ coupled to the first power supply rail $AV_{DD}$. The drain of transistor $MP_{34}$ connects to the source of transistor $MP_{35}$.

The class-AB control circuit 215 includes p-channel transistor $MP_{42}$ having a gate which couples to form a first input of the control circuit 215. This first input of control circuit 215 couples to the drain of transistor $MP_{37}$ of the summing circuit 210. A n-channel transistor $MN_{37}$ couples to form the second input of control circuit 215, wherein the gate of transistor $MN_{37}$ forms the second input and couples to the drain of the transistor $MN_{36}$ of the summing circuit 210. A diode connected n-channel transistor $MN_{31}$ couples between the second power supply rail $AV_{SS}$ and the drain of the transistor $MP_{42}$. A p-channel transistor $MP_{44}$ includes a drain the connects to the drain of transistor $MN_{37}$ and a gate that connects to the gate of transistor $MP_{42}$. P-channel transistors $MP_{40}$ and $MP_{43}$ have their gates connected together. Each source of transistors $MP_{40}$ and $MP_{43}$ connect to the first power supply rail $AV_{DD}$. Each drain of transistors $MP_{40}$ and $MP_{43}$ connects to a respective source of the transistor $MP_{42}$ and $MP_{44}$. The gate of transistor $MP_{43}$ connects to the drain of transistor $MP_{44}$.

Output stage 220 includes a p-channel transistor $MP_{46}$ and a n-channel transistor $MN_{38}$. The gate of transistor $MP_{46}$ couples to the first output of control circuit 220, wherein the gate of $MP_{44}$ connects to the gate of transistor $MP_{46}$. The gate of transistor $MN_{38}$ couples to the second output of control circuit 220, wherein the gate of $MN_{37}$ connects to the gate of transistor $MN_{38}$. The drains of transistors $MP_{46}$ and $MN_{38}$ connect to form the output $Out_2$ of amplifier 200. The source of transistors $MP_{46}$ and $MN_{38}$ connect to the first and second power supply rail, $AV_{DD}$ and $AV_{SS}$, respectively. In addition, the output stage 220 includes first and second AC compensation circuit $R_3$, $C_3$, $R_4$, and $C_4$. The first AC compensation circuit, $R_3$ and $C_3$, connects between the gate of transistor $MP_{44}$ and the output $Out_2$.

In operation, input stage 205 transistors $MP_{INM2}$ and $MP_{INP2}$ are connected to common gate transistors $MN_{33}$, $MN_{34}$, $MN_{35}$, and $MN_{36}$, wherein transistors $MN_{34}$, $MN_{35}$ and $MN_{36}$ make up the cascoding nodes. The conversion of the signal happens using transistors $MP_{34}$ and $MP_{35}$. A first pair of drains of transistors, $MP_{37}$ and $MN_{35}$, and a second pair of drains of transistors, $MP_{39}$ and $MN_{36}$ form a first and second summing node, $N_{26}$ and $N_{27}$, respectively. It is at these nodes, $N_{26}$ and $N_{27}$, where the summing and gain occurs for the input signals. The signal goes into the source of transistors, $MN_{35}$ and $MN_{36}$, and goes through the drain of both transistors, $MN_{35}$ and transistor $MN_{36}$, respectively. The signal also goes into the source of transistor $MN_{34}$ and exits through the drain of transistor $MN_{34}$. It travels further to the gate and drain of transistor $MP_{35}$. The signal is applied to the gate of $MP_{38}$ and exits through the drain of transistor $MP_{38}$. Following, the signal goes into the source of transistors $MP_{37}$ and $MP_{39}$.

From the first power supply rail $AV_{DD}$ to the gate of transistor $MP_{46}$, the voltage level is decremented by the gate-to-source voltage $V_{gs}$ of transistor $MP_{46}$ which is the threshold voltage for transistor $MP_{46}$ [$V_{gst}=(V_{gs}-V_t)\approx 100$ mv]. Transistor $MP_{43}$ must stay in saturation to keep amplifier 200 functional. As a result, transistor $MP_{44}$ must be a low threshold voltage transistor. Specifically, the voltage applied to the drain of transistor $MP_{43}$ is the value of the first power supply voltage $AV_{DD}$ decremented by the gate-to-source voltage $V_{gs}$ of transistor $MP_{46}$ and incremented by the gate-to-source voltage $V_{gs}$ of transistor $MP_{44}$. Since transistor $MP_{44}$ is a low threshold voltage transistor, however, the threshold voltage $V_t$ will be approximately 0.4 v as opposed to the threshold voltage $V_t$ of transistor $MP_{46}$ which is approximately 0.8 v. Thereby, approximately 0.4 v will be applied across the source to drain of transistor $MP_{43}$, in an effort to maintain transistor $MP_{43}$ in saturation.

Nodes, $N_{26}$ and $N_{27}$, have voltages that in phase, wherein when one node increases in voltage, the other node increases accordingly. When the output of the amplifier $Out_2$ is driven low, nodes, $N_{26}$ and $N_{27}$, transitioned high. As a result, the voltage at the gate of transistor $MP_{46}$ is much higher than in the known implementation of the low voltage amplifier. Therein, transistor $MP_{46}$ is almost turned off. Transistor $MP_{44}$, however, maintains its low threshold voltage $V_t$. In addition, since the voltage in node $N_{26}$ is higher than previously, there will not be enough voltage for transistor $MP_{43}$ to be on completely in saturation.

Further, the voltage at nodes $N_{26}$ and $N_{27}$ are in phase; thereby, as the voltage of node $N_{27}$ increases, the voltage of node $N_{26}$ increases. Accordingly, the DC current path is cut off by transistor $MP_{44}$. Since transistor $MP_{44}$ is a natural or low threshold voltage PMOS device, transistor $MP_{43}$ stays in the saturation region during normal operation. The threshold voltage $V_t$ of transistors, $MP_{43}$ and $MP_{44}$, track through all process variation, if there is only one implant difference in the fabrication process. This guarantees a robust manufacturable solution. The end result is that class-AB control circuit 215 functions in the same way it did before having added transistor $MP_{44}$, with the exception of minimal to zero surge current.

In summary, this approach provides an additional PMOS device, transistor $MP_{44}$, that turns off the DC current path that is composed of diode connected PMOS transistor $MP_{43}$ and sensing NMOS transistor $MN_{37}$ during the output clipping condition to minimize the surge current of amplifier 200. The low voltage amplifier in accordance with the present invention is typically used in low voltage applications of 1.5V.

In the alternative, a second embodiment may include a transistor $MP_{44}$ that is implemented using a standard threshold voltage $V_t$ device. In order for this implementation to be effective, transistors $MP_{43}$ and $MP_{44}$, would have to be properly sized, since transistor $MP_{43}$ will operate in the linear region given this alteration.

Figure 3:
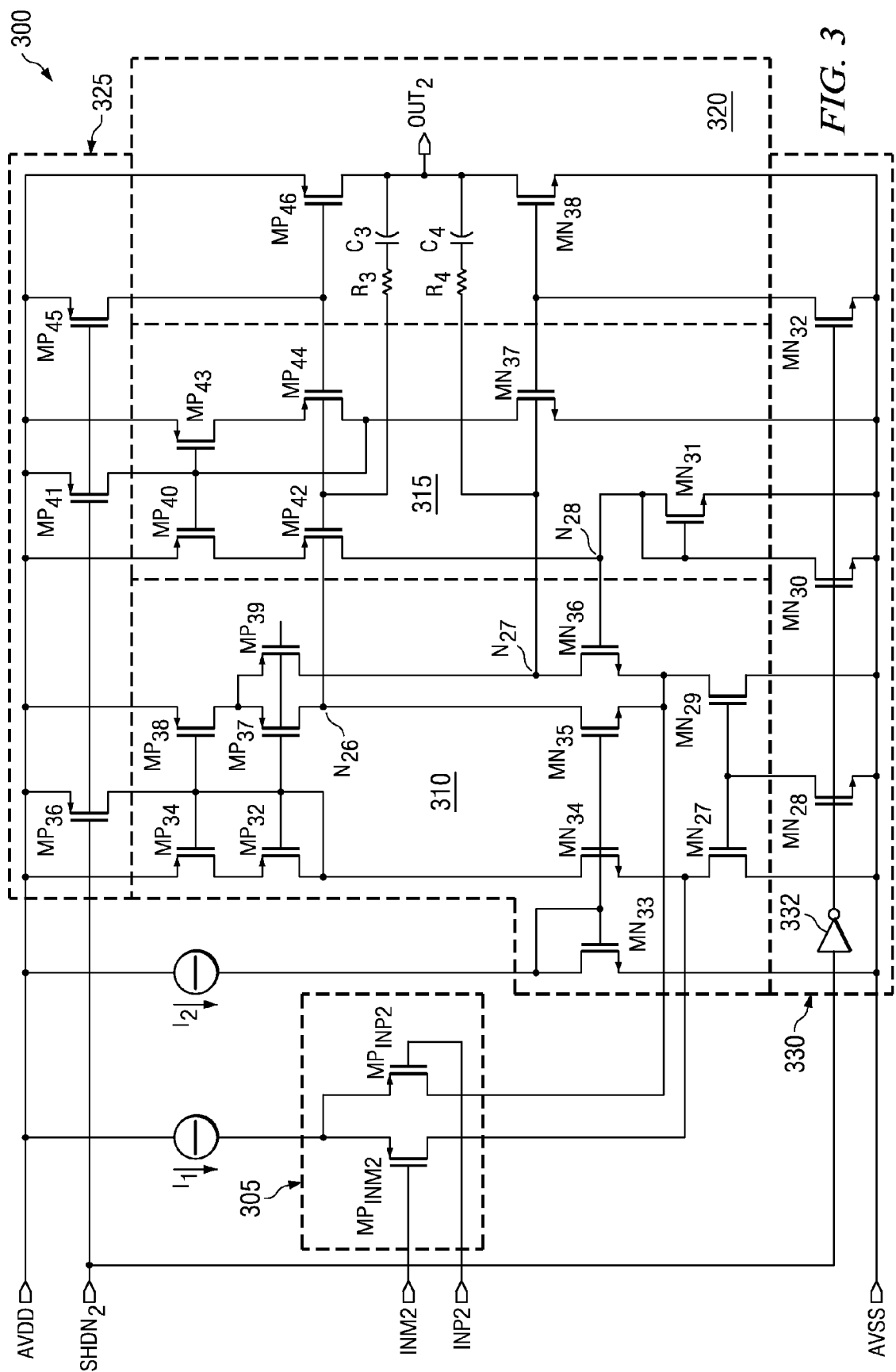
FIG. 3 shows a second embodiment of a low-voltage compact operational amplifier in accordance with the present invention.
Figure 4:
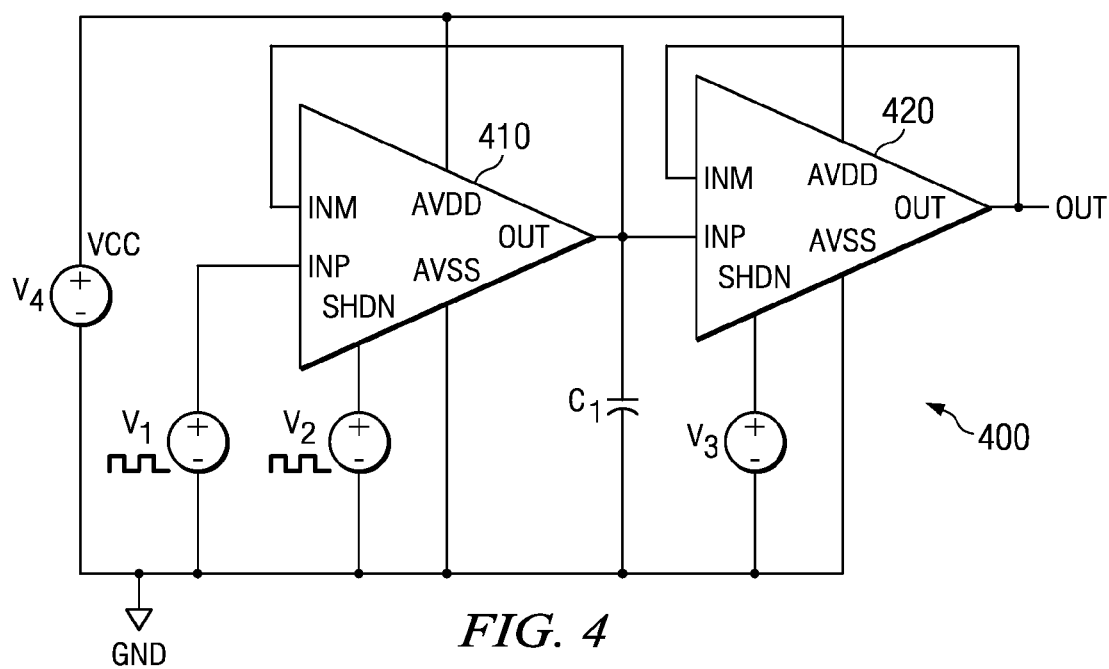
FIG. 4 illustrates a known sample and hold circuit that includes two amplifiers.

Another alternative embodiment of the low voltage amplifier 300 having an improved class-AB control circuit is shown in FIG. 3. This embodiment corresponds to the sample and hold circuit 400 that is illustrated in FIG. 4. The distinction between this embodiment of the amplifier 300 from the amplifier 200 in FIG. 2 is the addition of a first and a second shutdown circuit, 325 and 330. Specifically, amplifier 300 includes an input stage 305, a summing circuit 310, a class-AB control circuit 315, an output stage 320, and a first and a second shutdown circuit, 325 and 330; wherein, input stage 305, summing circuit 310, class-AB control circuit 315, and output stage 320 couple and are arranged similarly to amplifier 200 in FIG. 2.

The first shutdown circuit 325 includes p-channel transistors $MP_{36}$, $MP_{41}$, and $MP_{45}$. Each source of transistors $MP_{36}$, $MP_{41}$, and $MP_{45}$ connect to the first power supply rail $AV_{DD}$. The drain of transistors $MP_{36}$, $MP_{41}$, and $MP_{45}$ connects to the respective gates of transistor $MP_{38}$, $MP_{43}$, and $MP_{46}$. In operation, when the SHDN pin is high, transistors $MP_{36}$, $MP_{41}$ and $MP_{45}$ have a gate-to-source voltage $V_{gs}$ of zero which means that the transistors are off. Similarly, in the second shutdown circuit 330, inverter 332 inverts the SHDN signal such that transistors, $MN_{28}$, $MN_{30}$ and $MN_{32}$, have a gate to source voltage of zero. Thereby, transistors, $MN_{28}$, $MN_{30}$ and $MN_{32}$, are off as well.

Specifically, transistors, $MN_{35}$ and $MN_{36}$, form a differential pair comparing the fixed voltage generated by the fixed current provided by the second current source $I_2$ and the voltage at node $N_{28}$ which depends on the sensing circuitry in output stage 320. The current supplied by the second current source $I_2$ to the gate of transistor $MN_{33}$ sets the gate-to-source voltage $V_{gs}$ of transistor $MN_{33}$. The differential pair, transistors, $MN_{35}$ and $MN_{36}$, compares this voltage with the voltage at node $N_{28}$ and sets the voltage at nodes $N_{26}$ and $N_{27}$ so that the voltage at node $N_{28}$ is the same as the gate-to-source voltage $V_{gs}$ of transistor $MN_{33}$. When the SHDN pin goes high, however, transistors $MN_{28}$, $MN_{30}$ and $MN_{32}$ in the second shutdown circuit 330 turn on and clamp the class AB control circuit 315 and clamp the output stage 320. In addition, when the SHDN pin goes high, transistors $MP_{36}$, $MP_{41}$ and $MP_{45}$ turn on. Specifically, transistors $MP_{36}$, $MP_{41}$ and $MP_{45}$ short circuit the gate-to-source voltage of transistors $MP_{38}$ and $MP_{46}$ in the summing circuit 310 and the output stage 320, accordingly. Effectively, transistors, $MP_{38}$ and $MP_{46}$, are turned off, thereby turning off amplifier 300.

In FIG. 4, we have an illustration of a known sample and hold circuit 400 application from National Semiconductor's LMV 341 datasheet where the effects of the surge current problem may be observed. Specifically, sample and hold circuit 400 includes a first amplifier 410 connected to a second amplifier 420. Further, capacitor $C_1$ couples to charge up to the voltage of an input signal supplied to the first amplifier 410. Voltage source $V_4$ provides the power supplied for both amplifiers 410 and 420. The output of each amplifier feeds back to the negative input of each amplifier, 410 and 420, respectively. Voltage source $V_1$ provides input voltage to the positive input of amplifier 410, while voltage supplies, $V_2$ and $V_3$, provide voltage for the shut down signal SHDN.

Figure 5:
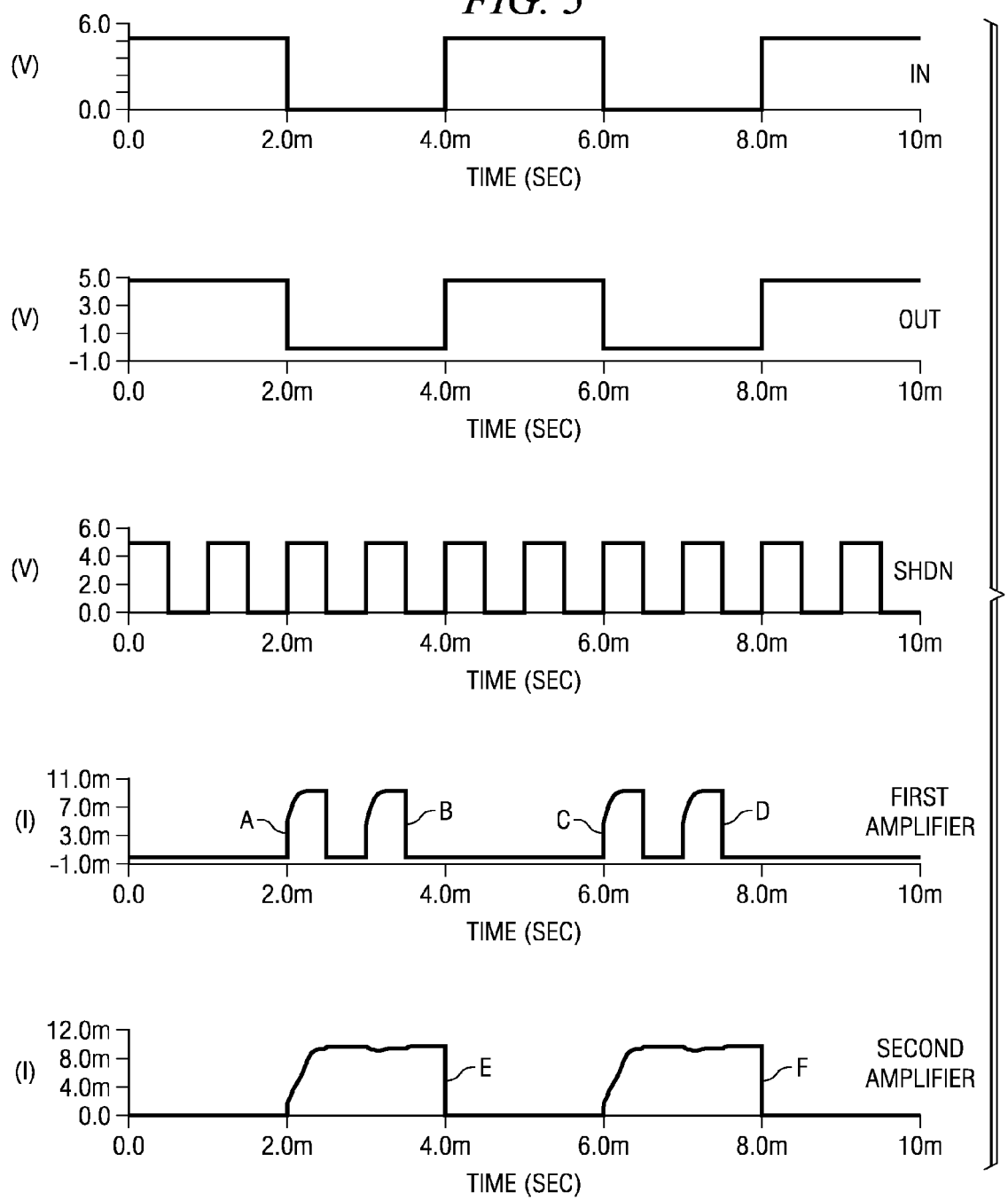
FIG. 5 is a timing diagram illustrating exemplary operation of the two amplifiers shown in FIG. 4 using the amplifiers of FIG. 1.

In FIG. 5, the operation of this sample and hold circuit 400 is shown, wherein a timing diagram is displayed to illustrate the exemplary operation of the sample and hold circuit application 400 using known amplifiers. First amplifier 400 is on when the shutdown signal SHDN is high. Accordingly, the first amplifier 410 turns on and off, tracking the SHDN signal clock frequency. Second amplifier 420 remains on. It can be noticed that the DC current through $MP_{43}$ jumps into the 10 mA range when the output of the op-amp is clipped to ground for both the first and second amplifier, 410 and 420. In the first amplifier 410, the surge current appears when the output is being clipped to ground and the shutdown signal SHDN is high. In the second amplifier 420, the surge current appears simply when the output is clipped to ground. When the output Out clips to ground and the shutdown pin SHDN goes high, each amplifier, 410 and 420, are turned on and they generate a surge of current. As shown and noted using points A, B, C and D, each surge of current for the first amplifier 410 corresponds to the shutdown pin SHDN going high during the time when the input and output signals are low. The surge for the second amplifier 420, however, always stays high as shown at points E and F, because the second amplifier 420 is always on. As a result, the surge current presents a problem where the RMS power burned in this circuit 400 is much higher than necessary.

Figure 6:
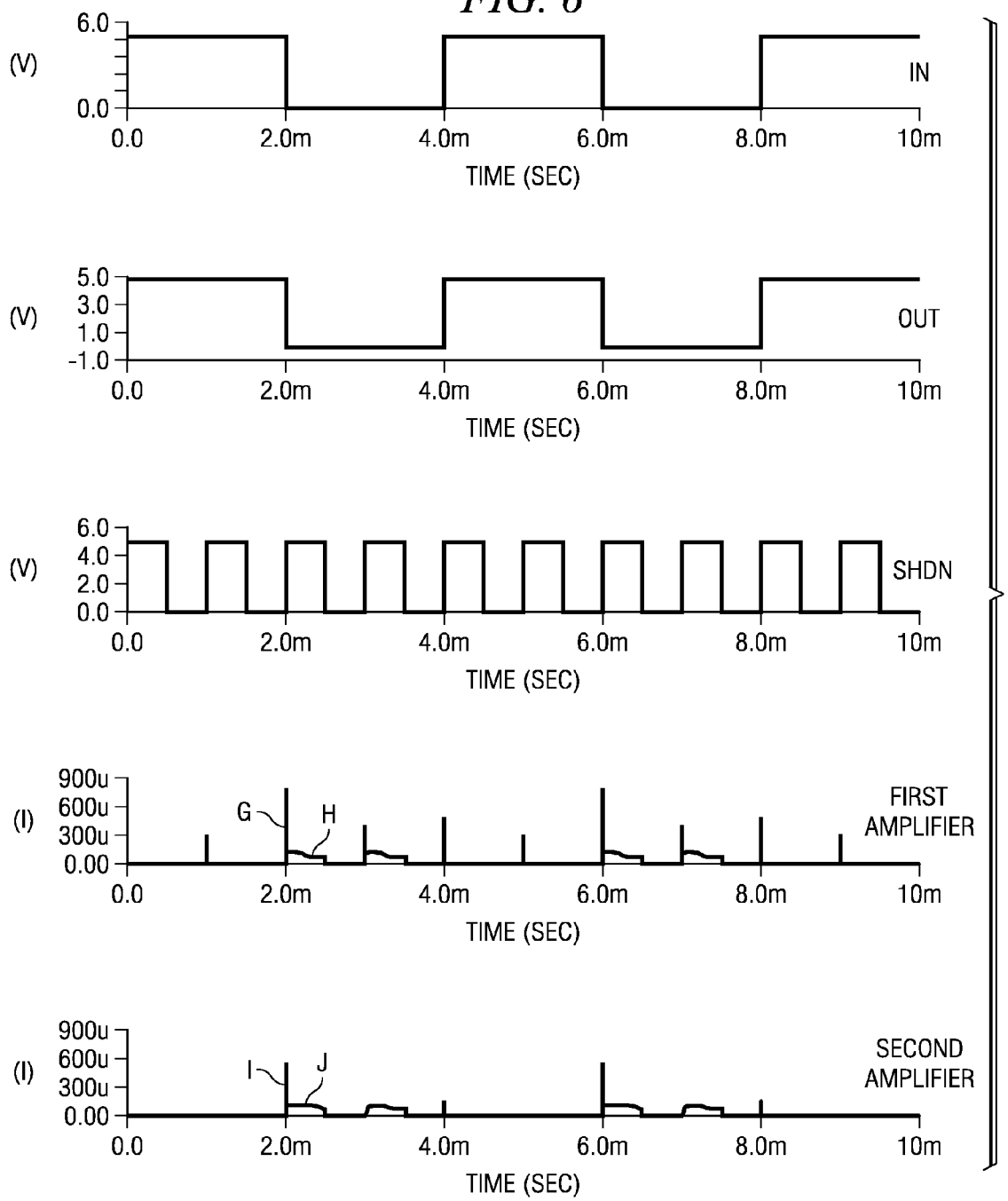
FIG. 6 is a timing diagram illustrating exemplary operation of the two amplifiers shown in FIG. 4 using the amplifiers of FIG. 3.

Referencing FIG. 6, the operation of this sample and hold circuit 400 is shown, wherein a timing diagram is displayed to illustrate the exemplary operation of the sample and hold circuit application 400 using amplifiers in accordance with the present invention from FIG. 3. When the shutdown signal SHDN is high, the first amplifier 410 turns on. Accordingly, the first amplifier 410 turns on and off, tracking the SHDN signal clock frequency. The second amplifier 420, however, remains on. It can be noticed at points, G and I, that the DC current through $MP_{43}$ spikes to approximately 600-800 microamps when the output of the op-amp is clipped to ground for both the first and second amplifier, 410 and 420. In the first amplifier 410, the surge current appears when the output is being clipped to ground and the shutdown signal SHDN is high. In the second amplifier 420, the surge current appears simply when the output is clipped to ground. Specifically, when the input and output of the sample and hold circuit 400 having amplifiers in accordance with the present invention goes low, the surge of current is spikes at the onset of the shutdown signal SHDN going high. Following, the spike of surge current, there remains a insubstantial amount of current ranging from approximately 25 to 68 microamps as shown at points, H and J. Therein, the surge current is diminished utilizing amplifiers in accordance with the present invention. This application is just one of the many illustrative examples where the current surge problem may be minimized.

Those of skill in the art will recognize that the physical location of the elements illustrated in FIGS. 2 and 3 can be moved or relocated while retaining the function described above. For example, another embodiment may use a transistor having a standard threshold voltage for transistor $MP_{44}$ and use of a resized transistor $MP_{43}$ double in size as express previously.

Advantages of this design include but are not limited to a low voltage amplifier having a class-AB control circuit that minimizes surge current, wherein there is a high performance, simple, and cost effective design.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. An amplifier, having a first power supply rail and a second power supply rail, comprising:
    a first current source coupled to the first power supply rail;
    an input stage coupled to the first current source, the input stage comprises,
        a pair of inputs for receiving a pair of differential input signals, and
        a pair of outputs for delivering a pair of differential intermediate signals in response to the pair of differential input signals;
    a second current source coupled to the first power supply rail;
    a summing circuit coupled to the second current source and the pair of outputs from the input stage and operable to sum the output of the input stage, the summing circuit coupled between the first power supply rail and the second power supply rail;
    a class-AB control circuit having a positive input, a negative input, and a differential output, the class-AB control circuit comprises,
        a first and a second p-channel transistor, each having a gate, a drain, and a source, the gates of the first and second p-channel transistor coupled together, the source of the first and second p-channel transistor connected to the first power supply rail,
        a third p-channel transistor, having a gate, a drain and a source, the source coupled to the drain of the first transistor, the gate coupled to the positive input,
        a fourth p-channel transistor, having a gate, a drain, and a source, the source coupled to the drain of the second transistor, the gate coupled to the gate of the third p-channel transistor to form a first terminal of the differential output,
        a first n-channel transistor, having a gate, a drain, and a source, the drain coupled to the drain of the fourth p-channel transistor, the source coupled to the second power supply rail, the gate coupled to the negative input to form a second terminal of the differential output, and
        a second n-channel transistor, having a gate, a drain, and a source, the gate coupled to the drain, the drain coupled to drain of the third p-channel transistor, the source coupled to the second power supply rail;
    an output stage, having a first input, a second input, and an output, the first and second inputs coupled to the class-AB control circuit, wherein the class-AB control circuit delivers an amplified input signal to the output stage, the output of the output stage delivers current to drive an external load, the output stage comprising a fifth p-channel transistor and a third n-channel transistor.

2. The amplifier of claim 1, wherein the input stage comprises:
    a sixth p-channel transistor, having a gate, a drain and a source, the source connected to the first current source, the gate coupled to form a first one of the pair of inputs, the drain coupled to form a first one of the pair of outputs; and
    a seventh p-channel transistor, having a gate, a drain and a source, the source connected to the first current source, the gate coupled to form a second one of the pair of inputs, the drain coupled to form a second one of the pair of outputs.

3. The amplifier of claim 1, wherein the summing circuit comprises:
    a sixth p-channel transistor, having a gate, a drain and a source, the source connected to the first power supply rail;
    a seventh p-channel transistor, having a gate, a drain and a source, the source connected to the first power supply rail, the gate coupled to the gate of the sixth p-channel transistor;
    a first current mirror, having a pair of eighth and ninth p-channel transistors, each of the pair of p-channel transistors having a gate, a drain, and a source, the gates of the pair of p-channel transistors coupled together, the drain of the eighth p-channel transistor coupled to the gate the eighth p-channel transistor, the source of the eighth p-channel transistor coupled to the drain of the sixth p-channel transistor, the source of the ninth p-channel transistor coupled to the drain of the seventh p-channel transistor;
    a tenth p-channel transistor, having a gate, a drain and a source, the source coupled to the drain of the seventh p-channel transistor, the gate coupled to the gates of the pair of p-channel transistors in the first current mirror,
    a second current mirror, having a pair of fourth and fifth n-channel transistors, each of the pair of n-channel transistors having a gate, a drain, and a source, the gates of the pair of n-channel transistors coupled together, the drain of the fourth n-channel transistor coupled to the gate the fourth n-channel transistor, the drain of the fourth n-channel transistor coupled to receive the current from the second current source, the source of the fourth n-channel transistor coupled to the second power supply rail, the drain of the fifth n-channel transistor coupled to the drain of the eighth p-channel transistor in the first current mirror, the source of the fifth n-channel transistor coupled to a first one of the outputs of the input stage;
    a third current source coupled between the source of the fifth n-channel transistor in the second current mirror and the second power supply rail;
    a sixth n-channel transistor, having a gate, a drain and a source, the drain coupled to the drain of the ninth p-channel transsistor of the first current mirror to form a first output, the gate coupled to the gates of the pair of n-channel transistors of the second current mirror, the source coupled to a second one of the outputs of the input stage;
    a fourth current source coupled between the source of the sixth n-channel transistor and the second power supply rail;
    a seventh n-channel transistor, having a gate, a drain and a source, the source coupled to the source of the sixth n-channel transistor, the drain coupled to the drain of the tenth p-channel transistor to form a second output, the gate coupled to the class-AB control circuit.

4. The amplifier of claim 1, wherein the output stage comprises:
    a sixth p-channel transistor, having a gate, a drain and a source, the source connected to the first power supply rail, the gate coupled to the first differential output of the class-AB control circuit;
    a first AC compensation circuit coupled between the drain of the sixth p-channel transistor and the first terminal of the differential output of the class-AB control circuit;

a fourth n-channel transistor, having a gate, a drain and a source, the source connected to the second power supply rail, the gate coupled to the second differential output of the class-AB control circuit, the drain coupled to the drain of the sixth p-channel transistor to form an output of the amplifier; and a second AC compensation circuit coupled between the drain of the fourth n-channel transistor and the second terminal of the differential output of the class-AB control circuit.

* * * * *